United States Patent [19]
Go

[11] Patent Number: 5,760,605
[45] Date of Patent: Jun. 2, 1998

[54] PROGRAMMABLE HIGH SPEED ROUTING SWITCH

[75] Inventor: Ying W. Go, Palo Alto, Calif.

[73] Assignee: Advanced Micro Devices, Inc., Sunnyvale, Calif.

[21] Appl. No.: 723,082

[22] Filed: Sep. 30, 1996

[51] Int. Cl.⁶ .................................................. H03K 19/094
[52] U.S. Cl. ........................ 326/49; 326/44; 340/825.91; 340/825.9
[58] Field of Search ........................ 326/49, 44, 41; 340/825.85, 825.86, 825.87, 825.88, 825.89, 825.9, 825.91

[56] References Cited

U.S. PATENT DOCUMENTS

| | | | |
|---|---|---|---|
| 4,870,304 | 9/1989 | Bloker et al. | 326/44 |
| 4,935,734 | 6/1990 | Austin | 340/825.87 |
| 5,015,885 | 5/1991 | El Gamal et al. | 340/825.91 |
| 5,251,169 | 10/1993 | Josephson | 326/49 |
| 5,319,261 | 6/1994 | Srinivasan et al. | 340/825.91 |
| 5,406,138 | 4/1995 | Srinivasan et al. | 326/44 |
| 5,465,056 | 11/1995 | Hsieh et al. | 340/825.87 |
| 5,559,971 | 9/1996 | Hsieh et al. | 340/825.89 |

*Primary Examiner*—Edward P. Westin
*Assistant Examiner*—Richard Roseen
*Attorney, Agent, or Firm*—Davis Chin

[57] ABSTRACT

A programmable high speed routing switch is provided which has a lower ON-resistance so as to increase its gate oxide reliability. The routing switch includes a non-volatile memory cell (12) having a floating gate (FG). The floating gate is selectively charged and discharged to provide either a net positive potential or a net negative potential. The routing switch also includes a memory transistor (14), a pass gate transistor (16), and a poly load element (18). The source of the memory transistor is connected to a first power supply potential. The gate of the memory transistor is connected to the floating gate of the memory cell, and the drain thereof is connected to the gate of the pass gate transistor and to a first end of the poly load element. The drain of the pass gate transistor is connected to a first signal line (PG1) and the source of the pass gate transistor is connected to a second signal line (PG2). The second end of the poly load element is connected to a second power supply potential.

20 Claims, 2 Drawing Sheets

PROGRAMMABLE HIGH SPEED ROUTING SWITCH

BACKGROUND OF THE INVENTION

This invention relates generally to switching circuits and more particularly, it relates to a programmable high speed routing switch which includes a poly load element. Specifically, the present invention has particular applications in various types of user programmable devices such as electrically erasable and programmable logic devices (EEPLD) so as to achieve programming of the same after chip manufacture.

As is generally known, arrays for performing logic functions, typically called logic arrays or programmable logic arrays, have been used in recent years to replace random logic in many complex digital circuits. Such programmable logic arrays are especially useful in the control section of microcomputer systems and controllers and are frequently thought of as read-only storage, read-only memories or the like. The programmable logic array is a well-known convenient way of using arrays of identical circuit elements to implement arbitrary logical functions in semiconductor integrated circuits.

Such programmable logic arrays (PLA) typically have a two "plane" structure, i.e., two separate regions or groupings of logic gates with the outputs from one region leading into the other. For instance, a typical PLA comprises a first array which generates product of sum terms and is referred to as the AND array or plane, and a second array which generates sum of product terms and is referred to as the "OR" array or plane. This type of two-plane PLA allows a large number of arbitrary logic equations to be implemented in an orderly manner. The orderly structure of PLAs is particularly advantageous in designing large scale integrated (LSI) or very large scale integrated (VLSI) systems.

In non-volatile memory devices, there exists an electrically erasable and programmable read-only memory (EEPROM) device having a floating gate referred to as "flash EEPROM" which has emerged as an important memory device by combining the advantages of EPROM density with EEPROM electrical erasability. The flash EEPROM device allows its programmed contents to be electrically erased so as to permit its reprogramming. The EEPROM device can be electrically erased within typically ten milliseconds which is different from the conventional EPROM devices that are erased in bulk by exposure to ultra-violet lights. The EEPROM device includes a single transistor having a source and a drain formed in a silicon substrate. The source and drain are separated from each other by a channel region. A gate insulation layer electrically insulates a polycrystalline silicon floating gate from the channel region and the drain. A very thin tunnel oxide region electrically insulates a small portion of the floating gate from the drain. An insulative layer is formed between the floating gate and a control gate.

In "flash" memory terminology, the EEPROM device has electrons added or injected into the floating gate in order to program a logic "0". This is achieved by the charging of the floating gate with electrons. In order to erase to a logic "1" in the EEPROM device, electrons are removed from the floating gate. This is achieved by the discharging of the electrons from the floating gate.

These EEPROM devices have been found to be particularly useful in programmable logic devices which are often called electrically erasable and programmable logic devices (EEPLD). In EEPLD terminology, the charging of the floating gate (adding electrons) is referred to as "erased" and the discharging of the floating gate (removing electrons) is referred to as "programming." It will be noted that this is opposite to the definition of the erase and programming in "flash" memory terminology.

Typically, the AND-OR array in a programmable logic array includes a plurality of row signal lines and a plurality of product signal lines intersecting the plurality of row signal lines. As is known in the art, programmable connections can be made at the intersections of the row signal lines and the product signal lines by utilizing transistor switches. In field programmable logic devices, a typical transistor switch includes an EEPROM cell which is programmed ON or OFF so as to produce an electrical connection at a particular point to be made or not between one of the plurality of product signal lines and a corresponding one of the plurality of row signal lines in the AND-OR array.

Further, in the prior art it is known that programming can be achieved by using the floating gate of the EEPROM cell to drive the gate of an N-channel transistor functioning as a load coupled to the gate of an N-channel enhancement-type pass transistor. The conduction path electrodes (source/drain) of the pass gate transistor is used to make the electrical connection between the row signal line and the product signal line. Since the source of the N-channel load transistor cannot be tied to a voltage lower than the ground potential (i.e., a negative voltage), this results in creating a high resistance in the pass gate transistor which adversely affects the switch connection. If an attempt was made to use a negative voltage, there would be caused the possibility that the junction between the substrate and the source region of the N-channel load transistor may become forward biased thus creating latch-up.

It would therefore be desirable to provide a programmable high speed routing switch which has a lower resistance in the pass gate, thereby increasing its gate oxide reliability. This is achieved in the present invention by utilizing a pass gate having a negative threshold and a poly load element connected between the gate of the pass transistor and a negative power supply voltage. As a result, the pass gate can be turned off or rendered non-conductive with the negative power supply voltage and can be turned on or rendered more conductive with the same power supply voltage. Consequently, the ON-resistance of the pass gate transistor will be reduced.

SUMMARY OF THE INVENTION

Accordingly, it is a general object of the present invention to provide a programmable high speed routing switch which overcomes the disadvantages of the prior art switching circuits.

It is an object of the present invention to provide a programmable high speed routing switch which has a lower resistance in the pass gate transistor in order to increase its gate oxide reliability.

It is another object of the present invention to provide a programmable high speed routing switch for use in programmable logic devices which includes a pass gate transistor having a negative threshold voltage and a poly load element connected between the gate of the pass gate transistor and a negative power supply voltage.

It is still another object of the present invention to provide a programmable high speed routing switch which includes a depletion-type pass gate transistor operated with a low gate field so as to produce an increased gate oxide reliability.

In accordance with these aims and objectives, the present invention is concerned with the provision of a programmable high speed routing switch for a programmable logic device which includes a non-volatile memory cell having a floating gate. The floating gate is selectively charged and discharged so as to produce either a net positive potential or a net negative potential. A memory transistor has a source, a drain, and a gate. A pass gate transistor has a drain, a source, and a gate. A poly load element is provided and has a first end and a second end.

The source of the memory transistor is connected to a first power supply potential. The gate of the memory transistor is connected to the floating gate of the memory cell. The drain of the memory transistor is connected to the gate of the pass gate transistor and to the first end of the poly load element. The drain of the pass gate transistor is connected to a first signal line and the source of the pass gate transistor is connected to a second signal line. The second end of the poly load element is connected to a second power supply potential.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENTS

It is to be distinctly understood at the outset that the present invention shown in association with a programmable logic device is not intended to serve as a limitation upon the scope or teachings thereof, but is merely for the purpose of convenience of illustration of one example of its application. The present invention has numerous applications in other fields and apparatus since the invention pertains to a programmable high speed routing switch.

Figure 1:
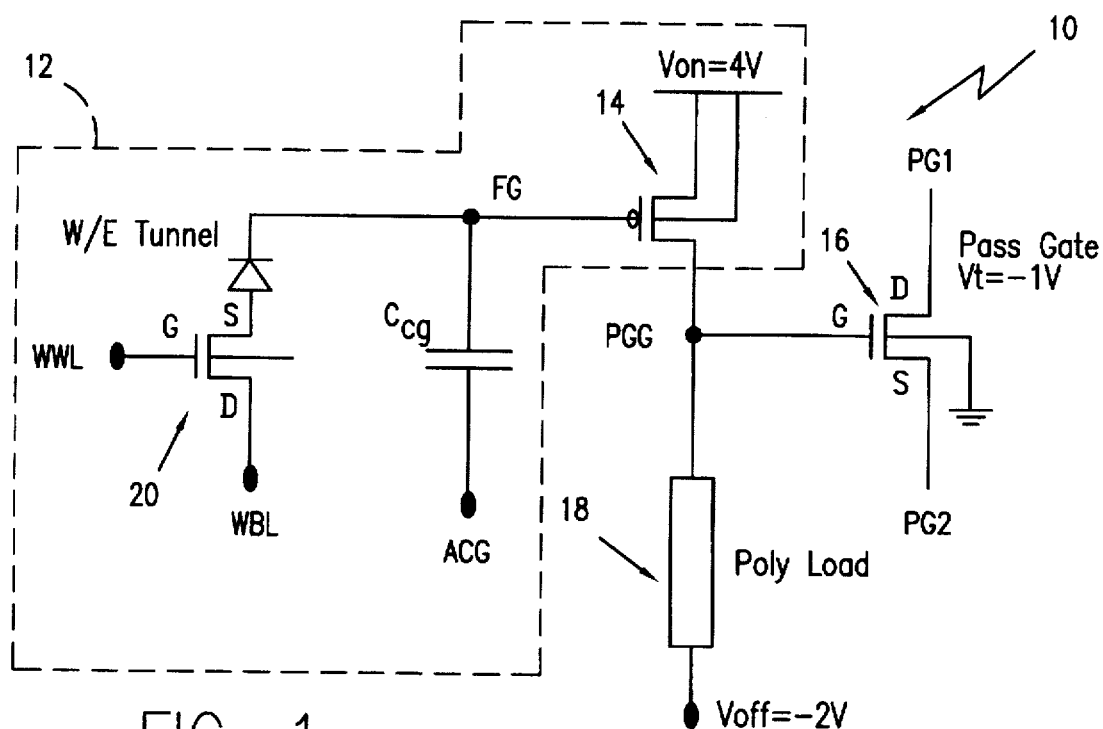
FIG. 1 is a schematic circuit diagram of a programmable high speed routing switch, constructed in accordance with the principles of the present invention.

Referring now in detail to the drawings, there is shown in FIG. 1 a schematic circuit diagram of a programmable high speed routing switch 10 for use in a programmable logic device, constructed in accordance with the principles of the present invention. The routing switch 10 is comprised of a non-volatile memory cell 12 having a memory transistor 14, a pass gate transistor 16, and a poly load element 18. The memory cell 12 is comprised of an electrically programmable and erasable memory transistor 14 which includes a floating gate FG. The memory transistor 14 is programmable to be normally-OFF by injecting electrons into the floating gate. The memory transistor is programmable to be ON by removing electrons from the floating gate. Once the memory transistor 14 has been programmed, the memory transistor functions as a field-effect transistor which remains switched either OFF or ON, even when the power source is disconnected.

As can be seen, the write word line WWL is connected to the gate G of the program transistor 20, and the write bit line WBL is connected to the drain D of the program transistor. The tunnel oxide is represented by a diode W/E Tunnel interconnected between the source S of the program transistor 20 and the floating gate FG. The gate oxide is represented by a capacitor $C_{cg}$ interconnected between the control gate line ACG and the floating gate FG.

The memory transistor 14 is comprised of a P-channel enhancement-type transistor. The source and substrate of the memory transistor 14 are connected together and to a positive power supply potential or voltage $V_{on}$, which is typically at +4.0 volts. The gate of the memory transistor 14 is connected to the floating gate FG of the memory cell 12. The pass gate transistor 16 is an N-channel depletion-type transistor having a threshold voltage of approximately −1.0 volts. The pass gate transistor 16 has its gate connected to a node PGG, to the drain of the memory transistor 14, and to one end of the poly load element 18. The drain of the pass gate transistor 16 may be connected, for example, to one of the plurality of product signal lines at PG1 in an AND-OR array of a programmable logic array, and the source of the pass gate transistor 16 may be connected to a corresponding one of the plurality of row signal lines at PG2 in the AND-OR array. The substrate of the pass gate transistor is connected to a ground potential. The other end of the poly gate load element 18 is connected to a negative power supply potential $V_{off}$ which is typically at −2.0 volts.

The operation of the routing switch 10 will now be explained in detail. The memory transistor 14 is rendered conductive or non-conductive as determined by the charge on the floating gate FG of the memory cell 12. When there is a net positive charge or potential on the floating gate FG, the memory transistor 14 will be rendered non-conductive or turned off. Thus, the negative power supply potential of −2.0 volts will be applied to the node PGG via the high impedance of the poly load element 18, which will in turn shut-off the pass gate transistor 16. As a result, no electrical connection will be made between the first signal line PG1 and the second signal line PG2 through the conduction path (drain/source) of the pass gate transistor 16.

On the other hand, when there is a net negative charge or potential on the floating gate FG the memory transistor 14 will be rendered conductive or turned on. Thus, the positive power supply potential of +4.0 volts will be applied to the node PGG, which will in turn turn-on hard the pass gate transistor 16. Since the gate overdrive is increased by approximately 0.7 volts plus the absolute value of the threshold voltage of the pass gate transistor, the ON resistance of the pass gate transistor is reduced. Consequently, there will be made an electrical connection between the first signal line PG1 and the second signal line PG2 through the conduction path with a smaller amount of resistance, thereby minimizing the resistance in the programmable switch. In this manner, a low gate field can be used so as to produce an increased gate oxide reliability.

In Table I listed below, there is shown the various voltages applied to the circuit diagram of FIG. 1 in order to effect the three operations of the memory cell 12 in the routing switch 10 which are program (write), erase and read:

TABLE I

|  | ACG | WWL | WBL |
|---|---|---|---|
| (read) R: | 3.0 V | 0 | float |
| (program) P: | 0 | 13.0 V | 11.0 V |
| (erase) E: | 11.0 V | 3.3 V | 0 |

When the floating gate FG is written upon or programmed the floating gate FG is given a positive charge by removing (discharging) electrons from the floating gate FG. In order to accomplish this program function, a high programming voltage of approximately +13.0 volts is applied to the write word line WWL, a first write voltage of approximately +11.0 volts is applied to the write bit line WBL, and the control gate line ACG is grounded. Thus, the program transistor 20 will be turned ON and the first write voltage applied to its drain will be coupled to its source. Since the source of the program transistor 20 is at a high voltage and the control gate line ACG is grounded, the high voltage is capacitively coupled to the floating gate FG due to the electric field created between the source and the floating gate FG through the tunnel oxide W/E Tunnel. As a result, electrons will tunnel from the floating gate to the source of the program transistor 20 through the tunnel oxide. Thus a net positive potential is maintained on the floating gate FG (even when the power supply potential is removed) and will cause the memory transistor 14 to be rendered non-conductive. Consequently, the pass gate transistor 16 will be turned off by the negative power supply potential applied to its gate G via the poly load element 18 and no electrical connection will be made between the first signal line PG1 and the second signal line PG2. Accordingly, this routing switch is referred to as being normally-OFF.

In order to erase the floating gate FG, a high programming voltage of approximately +11.0 volts is applied to the control gate line ACG, a word line voltage of +3.3 volts is applied to the write word line WWL and the write bit line WBL is grounded. Under this biasing condition, the program transistor will again be turned on causing the ground potential applied to its drain to be coupled to its source. Since the control gate line ACG is now at a high potential and the source of the program transistor 20 is at the ground potential, the high voltage is capacitively coupled to the floating gate FG to create a negative electric field between the source and the floating gate FG through the tunnel oxide. This causes electrons to tunnel from the source through the tunnel oxide to the floating gate, resulting in a net negative potential on the floating gate. Thus, this net negative potential is maintained on the floating gate FG (even when the power supply potential is removed) and will cause the memory transistor 14 to be rendered conductive. Consequently, the pass gate transistor 16 will be turned ON by the positive power supply potential $V_{on}$ applied to the node PGG. An electrical connection will now be made between the first signal line PG1 and the second signal line PG2. Accordingly, the routing switch will be turned ON.

For reading the state of the memory transistor 14, an operating voltage of +3.0 volts is applied to the control gate line ACG, the write word line is grounded, and the write bit line is allowed to float. Under this condition, the operating voltage will be insufficient to overcome the charge on the floating gate FG if it has been charged (erased). However, the operating voltage will be sufficient to overcome the charge of a floating gate if it has been discharged (programmed).

Figure 2:
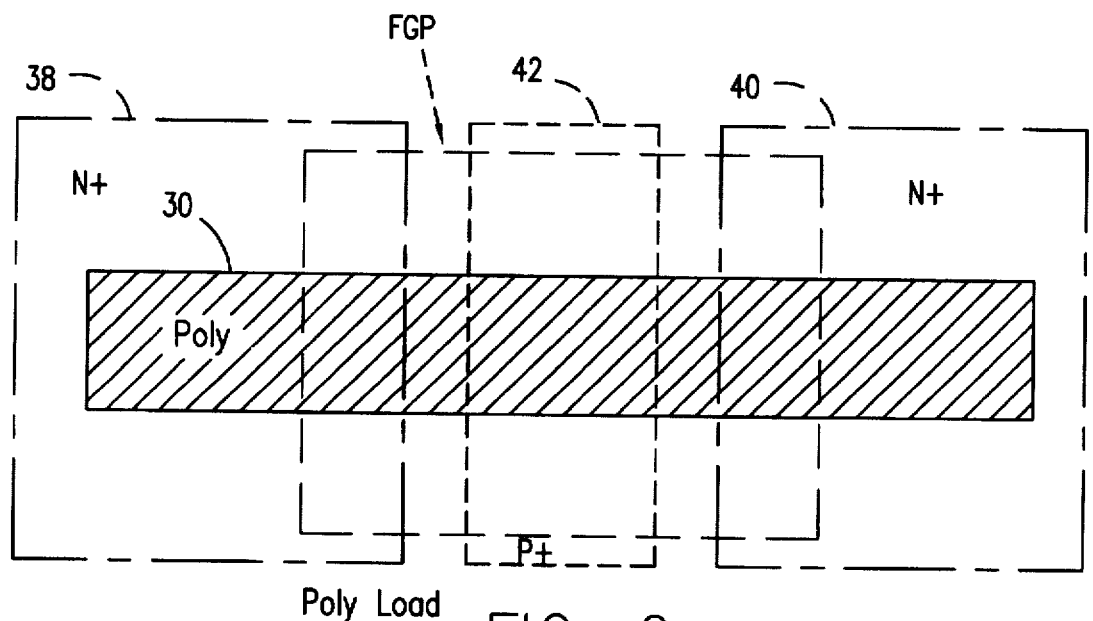
FIG. 2 is a top plan view of the layout for the poly load element for use in the circuit diagram of FIG. 1.
Figure 3:
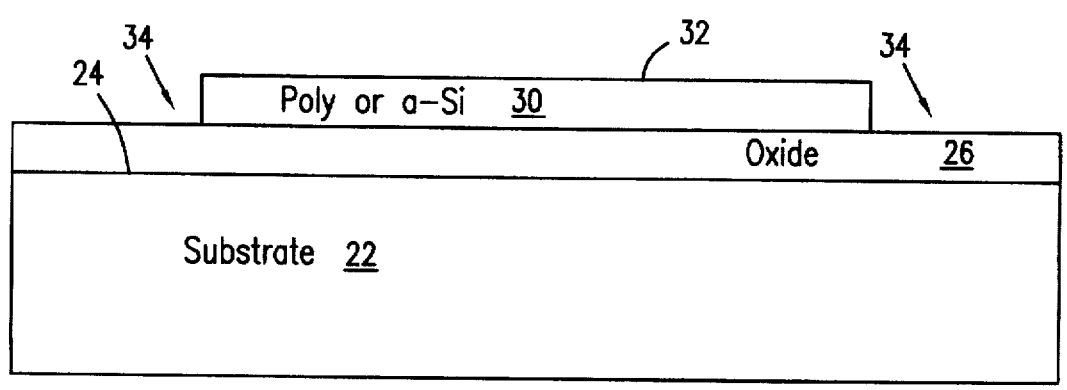
FIG. 3 shows the beginning steps for producing the poly load element of FIG. 2.

A top plan view of the layout of the poly load element 18 is illustrated in FIG. 2. While there are many ways to form the poly load element as is well-known to those skilled in the art, one preferred method for producing the poly load element of FIG. 2 in accordance with the present invention will be described using FIGS. 3 and 4. Beginning with FIG. 3, the process is started by providing a substrate 22, which is preferably a P-type silicon having a resistivity in a range of 16–24 ohm-cm, with the most preferred resistivity being approximately 20 ohm-cm. On the top surface 24 of the substrate, a silicon dioxide is grown in a dry oxide atmosphere to a thickness of approximately 400 Å to provide an oxide layer 26.

Next, polysilicon or amorphous silicon 30 is deposited on the structure. Then, a field implant may be performed preferably with boron at a dosage in the range of 1E12 to 1E14 and an energy level of 35 Kev. Following the implant, photoresist is applied to the surface 32 and is patterned to leave unprotected those portions of the polysilicon 30 to be removed, such as areas 34. The photoresist layer (not shown) is then removed using conventional processes.

Figure 4:
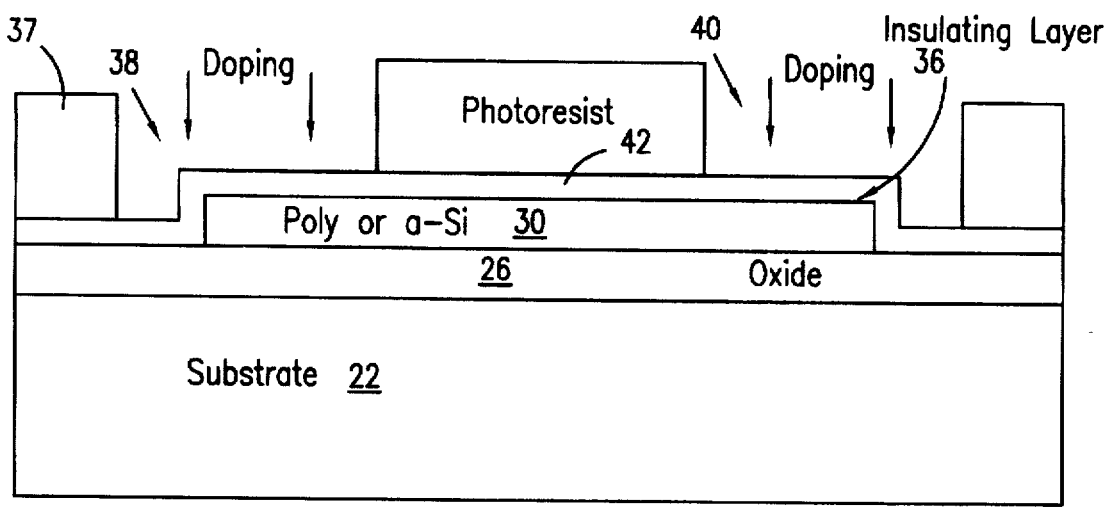
FIG. 4 shows the subsequent steps for producing the poly load element of FIG. 2.

Referring now to FIG. 4, an insulating layer 36 preferably formed of an oxide, nitride, or a combination thereof is grown to a thickness of approximately 200 Å by a well known dry oxide process. Following the insulating layer step, contact N+ implant mask 37 is provided so as to form the N+ implant regions 38 and 40. Then, a contact P+ implant mask is provided so as to form the P+ implant region 42. Finally, connection to the poly load element may be made through the doped N+ regions 38 and 40 via a metal-to-polysilicon connection or through a normal metal-to-metal connection, as is well known to those skilled in the art.

Figure 5:
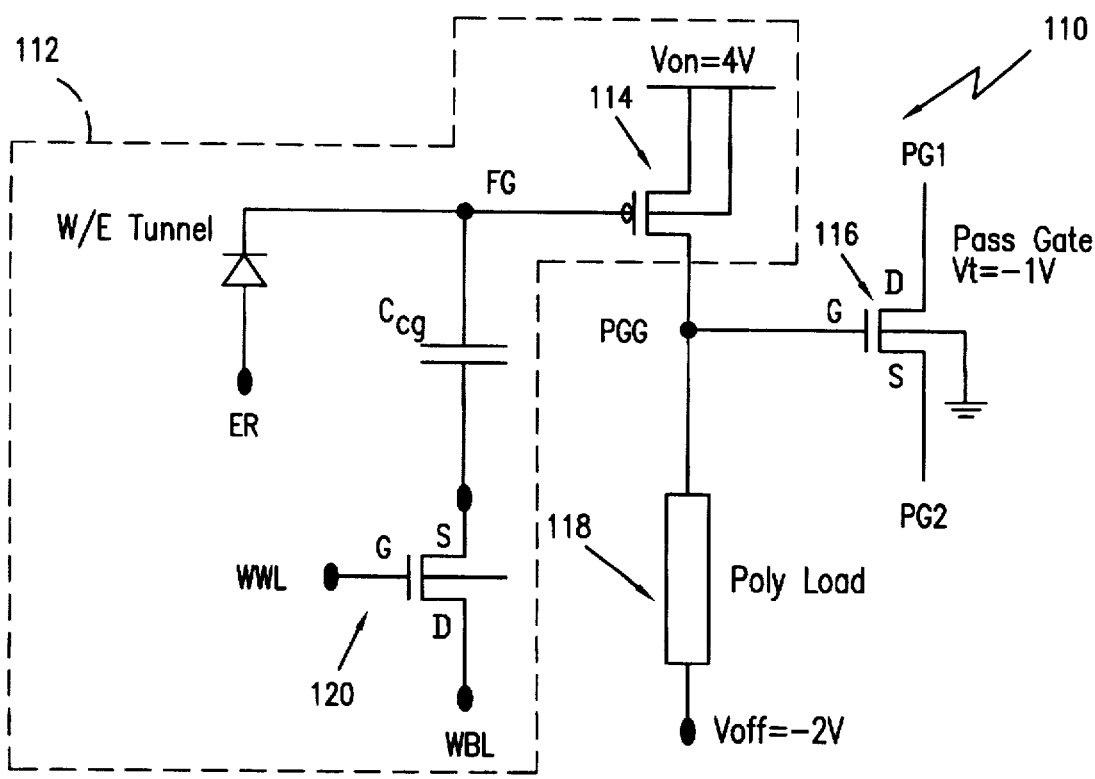
FIG. 5 is a schematic circuit diagram of a second embodiment of a programmable high speed routing switch of the present invention.

In FIG. 5, there is shown a schematic circuit diagram of a second embodiment of a programmable high speed routing switch 110 of the present invention. The routing switch 110 is identical to the switch 10 of FIG. 1, except that the gate oxide $C_{cg}$ is interconnected between the source of the program transistor 120 and the floating gate FG and that the tunnel oxide W/E Tunnel is connected to an erase line ER. In Table II listed below, there is shown the various voltages applied to the circuit diagram of FIG. 5 in order to effect the three operations of the memory cell 112 in the routing switch 110 which are program (write), erase and read:

TABLE II

|  | ER | WWL | WBL |
|---|---|---|---|
| (read) R: | 3.0 V | 0 | float |
| (program) P: | 0 | 13.0 V | 11.0 V |
| (erase) E: | 11.0 V | 3.3 V | 0 |

In operation, with the programming bias condition being applied electrons will be added to the floating gate FG and it will have a net negative potential. This will cause the memory transistor 114 to be turned on. As a result, the pass gate transistor 116 will be conductive, thereby making an electrical connection between the first signal line PG1 and the second signal line PG2. Thus, this routing switch 110 is referred to as normally-ON. When the erase bias conditions are applied, electrons will be removed (discharged) from the floating gate FG and it will have a net positive potential. This will cause the memory transistor 114 to be turned off. Consequently, the pass gate transistor 116 will be rendered non-conductive due to the negative power supply potential applied to the node PGG via the poly load element 118. As a result, the pass gate transistor 116 is rendered non-conductive, thereby making no electrical connection between the first signal line PG1 and the second signal line PG2.

It should be clearly understood to those skilled in the art that the memory cells 12 and 112 in the respective FIGS. 1 and 5 are but two examples of preferred embodiments. However, any type of non-volatile memory cell having a floating gate which can be charged and discharged so as to turn ON and OFF the memory transistor may be used in the alternative.

From the foregoing detailed description, it can thus be seen that the present invention provides a programmable high speed routing switch which has a lower ON-resistance in the pass gate, thereby increasing its gate oxide reliability. The routing switch of the present invention includes an N-channel depletion-type pass gate transistor having a negative threshold voltage and a poly load element connected between the gate of the pass gate transistor and a negative power supply potential. A non-volatile memory cell having a floating gate is used to produce either a net positive potential or a net negative potential which is coupled to the gate of a memory transistor.

While there has been illustrated and described what are at present considered to be preferred embodiments of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiments disclosed as the best modes contemplated for carrying out the invention, but that the invention will include all embodiments falling within the scope of the appended claims.

I claim:

1. A programmable high speed routing switch for a programmable logic device comprising:
   a non-volatile memory cell (12) having a floating gate (FG), said floating gate being selectively charged and discharged to provide either a net positive potential or a net negative potential;
   a memory transistor (14) having a source, a drain, and a gate;
   a pass gate transistor (16) having a drain, a source, and a gate;
   a poly load element (18) having a first end and a second end;
   the source of said memory transistor being connected to a first power supply potential, the gate of said memory transistor being connected to said floating gate of said memory cell, the drain of said memory transistor being connected to the gate of said pass gate transistor and to said first end of said poly load element; and
   the drain of said pass gate transistor being connected to a first signal line (PG1) and the source of said pass gate transistor being connected to a second signal line (PG2), the second end of said poly load element being connected to a second power supply potential.

2. A programmable high speed routing switch as claimed in claim 1, wherein said memory transistor is comprised of a P-channel enhancement transistor.

3. A programmable high speed routing switch as claimed in claim 1, wherein said pass gate transistor is comprised of an N-channel depletion transistor.

4. A programmable high speed routing switch as claimed in claim 1, wherein said first power supply potential is a positive voltage of approximately +4.0 volts.

5. A programmable high speed routing switch as claimed in claim 1, wherein said second power supply potential is a negative voltage of approximately −2.0 volts.

6. A programmable high speed routing switch as claimed in claim 1, wherein said non-volatile memory cell is comprised of a program transistor (20) having a drain, a source, a control gate, and the floating gate.

7. A programmable high speed routing switch as claimed in claim 6, wherein said program transistor has its drain connected to a write bit line (WBL), its control gate connected to a write word line (WWL), and its source capacitively coupled to its floating gate via a tunnel oxide (W/E Tunnel), the floating gate being further capacitively coupled to a control gate line (ACG) via a gate oxide.

8. A programmable high speed routing switch as claimed in claim 7, wherein during a programming mode a high programming voltage is applied to said write word line (WWL), a first write voltage substantially equal to the high programming voltage is applied to the write bit line (WBL), and a ground potential is applied to the control gate line (ACG) so as to discharge the floating gate to produce said net positive potential.

9. A programmable high speed routing switch as claimed in claim 8, wherein during an erase mode the first write voltage is applied to the control gate line (ACG), a second write voltage is applied to the write word line (WWL), and the ground potential is applied to the write bit line (WBL) so as to charge the floating gate to produce said net negative potential.

10. A programmable high speed routing switch as claimed in claim 6, wherein said program transistor has its drain connected to a write bit line (WBL), its control gate connected to a write word line (WWL), and its source capacitively coupled to its floating gate via a gate oxide ($C_{cg}$), the floating gate being further capacitively coupled to an erase line (ER) via a tunnel oxide (W/E Tunnel).

11. A programmable high speed routing switch as claimed in claim 8, wherein said memory transistor is rendered non-conductive and said pass gate transistor is rendered non-conductive by said second power supply potential via said poly load element so that no electrical connection is made between said first and second signal lines.

12. A programmable high speed routing switch as claimed in claim 9, wherein said memory transistor is rendered conductive and said pass gate transistor is rendered conductive by said first power supply potential so that an electrical connection is made between said first and second signal lines.

13. A programmable high speed routing switch comprising:
   a non-volatile memory cell (12) having a floating gate (FG), said floating gate being selectively charged and discharged to provide either a net positive potential or a net negative potential;
   pass gate means responsive to said positive and negative potentials on said floating gate for selectively connecting and disconnecting an electrical connection; and
   a poly load element having its one end connected to said pass gate means and its other end connected to a negative power supply potential.

14. A programmable high speed routing switch as claimed in claim 13, wherein said pass gate means is comprised of a pass gate transistor having a drain, a source, and a gate.

15. A programmable high speed routing switch as claimed in claim 14, wherein said pass gate transistor is comprised of an N-channel depletion transistor.

16. A programmable high speed routing switch as claimed in claim 13, wherein said negative power supply potential is a negative voltage of approximately −2.0 volts.

17. A programmable high speed routing switch as claimed in claim 13, wherein said non-volatile memory cell is comprised of a program transistor (20) having a drain, a source, a control gate, and the floating gate.

18. A programmable high speed routing switch as claimed in claim 17, wherein said program transistor has its drain connected to a write bit line (WBL), its control gate connected to a write word line (WWL), and its source capacitively coupled to its floating gate via a tunnel oxide (W/E Tunnel), the floating gate being further capacitively coupled to a control gate line (ACG) via a gate oxide.

19. A programmable high speed routing switch as claimed in claim 18, wherein during a programming mode a high programming voltage is applied to said write word line (WWL), a first write voltage substantially equal to the high programming voltage is applied to the write bit line (WBL), and a ground potential is applied to the control gate line (ACG) so as to discharge the floating gate to produce said net positive potential.

20. A programmable high speed routing switch as claimed in claim 19, wherein during an erase mode the first write voltage is applied to the control gate line (ACG), a second write voltage is applied to the write word line (WWL), and the ground potential is applied to the write bit line (WBL) so as to charge the floating gate to produce said net negative potential.

\* \* \* \* \*